United States Patent [19]

Tatman et al.

[11] Patent Number: 5,255,271
[45] Date of Patent: Oct. 19, 1993

[54] INTEGRATED CIRCUIT INTERNAL TEST MODE INDICATOR CIRCUIT

[75] Inventors: David Tatman, Missouri City; Phat C. Truong, Houston, both of Tex.

[73] Assignee: Texas Instruments Incorporated, Dallas, Tex.

[21] Appl. No.: 574,823

[22] Filed: Aug. 30, 1990

[51] Int. Cl.$^5$ ............................................. G01R 31/28
[52] U.S. Cl. ............................. 371/22.1; 324/158 R; 371/21.1; 371/22.5
[58] Field of Search ............... 371/21.1, 21.3, 22.1, 371/22.5; 324/73.1, 158 R

[56] References Cited

U.S. PATENT DOCUMENTS

| | | | |
|---|---|---|---|
| 4,380,070 | 4/1983 | Steiner | 371/25.1 |
| 4,924,391 | 5/1990 | Hirano | 364/424.03 |
| 4,975,641 | 12/1990 | Tanaka et al. | 324/158 R |
| 5,051,996 | 9/1991 | Bergeson et al. | 371/22.4 |

*Primary Examiner*—Charles E. Atkinson
*Attorney, Agent, or Firm*—Theodore D. Lindgren; Leo N. Heiting; Richard L. Donaldson

[57] ABSTRACT

The indicator circuit and method of this invention include an OR circuit having at least two inputs and an output. A signature mode signal input is connected to one input of the OR circuit and a special test mode signal input is connected to a second input of the OR circuit. A logic circuit for providing indicator signals has at least three inputs and at least two outputs. A first input to the logic circuit is connected to the output of the OR circuit. At least one signature address signal is connected to a second input of the logic circuit. The signal indicating the results of the special test mode is connected to a third input of the logic circuit. A first preprogrammed code indicator circuit has an input connected to a first output of the logic circuit and a second preprogrammed code indicator has an input connected to a second output of the logic circuit. The first preprogrammed code indicator may contain, for example, a manufacturer code. The second preprogrammed code indicator may contain, for example, a device code.

12 Claims, 3 Drawing Sheets

ADDRESS INPUT

| PRE-DECODER | | | | | | | |
|---|---|---|---|---|---|---|---|
| PROGRAM PATH | | | | | | | |
| REDUNDANT ROWS | WORDLINE DECODER AND DRIVERS | R E D U N D A N T | C O L U M N S | REDUNDANT ROWS | REDUNDANT ROWS | WORDLINE DECODER AND DRIVERS | REDUNDANT ROWS |
| 512x512 MEMORY CELL ARRAY | | | | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | R E D U N D A N T | C O L U M N S | 512x512 MEMORY CELL ARRAY | 512x512 MEMORY CELL ARRAY | WORDLINE DECODER AND DRIVERS | 512x512 MEMORY CELL ARRAY |
| 512x512 MEMORY CELL ARRAY | | R E D U N D A N T | C O L U M N S | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | R E D U N D A N T | C O L U M N S | 512x512 MEMORY CELL ARRAY | 512x512 MEMORY CELL ARRAY | WORDLINE DECODER AND DRIVERS | 512x512 MEMORY CELL ARRAY |
| VIRTUAL GROUND DECODER | COLUMN DECODER | VIRTUAL GROUND DECODER | | VIRTUAL GROUND DECODER | COLUMN DECODER | VIRTUAL GROUND DECODER | |
| SENSE AMPS | | SENSE AMPS | | SENSE AMPS | | SENSE AMPS | |

DATA INPUT/OUTPUT

Fig. 1

INTEGRATED CIRCUIT INTERNAL TEST MODE INDICATOR CIRCUIT

BACKGROUND OF THE INVENTION

This invention relates to integrated circuits and printed circuit boards, including electrically-programmable, read-only-memory (EPROM) arrays, and to a sub-circuit and method for indicating the results of internal tests on those integrated circuits.

Design-for-test methods allow extended testing of an integrated circuit or a printed circuit board. In order for the special test to be effective, an observer must be able to detect the results of the special test by reading the output of the special test circuitry.

An EPROM array is but one example of a circuit or device in which the circuit and method of this invention may be used. EPROM arrays include floating-gate memory cells arranged in rows and columns. The floating gate of a programmed memory cell is charged with electrons, and the electrons in turn render the source-drain path under the charged floating gate nonconductive when a chosen wordline select voltage is applied to the control gate. The nonconductive state is read as a "zero" bit. The floating gate of a non-programmed cell is neutrally charged such that the source-drain path under the non-programmed floating gate is conductive when the same chosen wordline select voltage is applied to the control gate. The conductive state is read as a "one" bit.

Each column and row of an EPROM array may contain thousands of cells. The sources of each cell in a column are connected to a source-column line. The drains of each cell in a column are connected to a separate bitline (drain-column line). The control gates of each cell in a row are connected to a wordline.

During cell programming, appropriate programming voltages applied to the selected control-gate wordline and drain bitline to create a high-current condition in the selected channel region, injecting channel-hot electrons and/or avalanche-breakdown electrons across the channel oxide to the floating gate.

To improve manufacturing yield, redundant columns and rows of memory cells are used to replace columns or rows with defective memory cells. The integrated memory circuit may include a set of links or fuses that are programmed to provide address information pertaining to the columns or rows with the defective memory cells. Address information in the set of links or fuses is compared with the incoming addresses, and input and output data are routed to the redundant rows or columns.

Chips manufactured with "closed" electrical links as elements to program redundant address data may be programmed by electrically opening selected links with high currents and/or electric fields or may be programmed by using a laser to "explode" the link. Chips that are manufactured with "opened"0 electrical links between two layers may be programmed by causing the links to form resistive shorts.

For the first case, in which selected "closed" links are "opened" during programming, complete "opens" are not always formed. Marginally opened links (or fuses) can cause incorrect results at different operating conditions or sequences. Typically, these are screened or tested by some complex or some non-standard method. Often, a new screen test will have to be developed for each new device.

A circuit and method to test the resistance of the open state of a packaged integrated circuit in response to a special test is described in U.S. patent application Ser. No. 07/574,835, filed Aug. 30, 1990 and also assigned to Texas Instruments Incorporated. The circuit described in that Application requires some means for transmitting the internal test results to the external environment.

Previous methods for observing the results of special test modes have required forcing special output results on normal output pins or have required adding hidden output modes on input/output pins or pads. Creating special pads requires added chip area for the pad and for driver circuits. In general, adding a hidden output mode on an input/output pad also requires added chip area. In many cases, output driver capacitance is increased by the added circuitry, adversely affecting response time for all circuit operations. In addition, electrostatic discharge capability may be adversely affected by the added circuitry.

Consequently, there is a need for a circuit and method for observing the results of an internal test mode using existing output states. Use of existing output states would not require adding hidden output modes, would not increase the output driver capacitance, and would not adversely affect electrostatic discharge capability.

The capability to furnish electronic signatures in response to certain inputs is a standard feature on many integrated circuits, including EPROMs. Industry standards require that, during the electronic signature mode of operation, two data codes be available at the outputs of an integrated circuit, the two data codes depending on the state of the A0 input pin. The two data codes identify the manufacturer and device type of the integrated circuit, i.e.:

Manufacturer Code: (Inputs: A9=12V, A0=0V) Output Code=10010111 97

Device Code: (Inputs: A9=12V, A0=5V) Output Code=00110010 32

SUMMARY OF THE INVENTION

The circuit and process of this invention utilize the electronic signature codes (the device code and the manufacturer code) to provide an indication of the results of special internal tests performed on an integrated circuit. Using the example above, the results of the tests may be indicated by the following:

Special Test PASS: Output Code=10010111 97

Special Test FAIL: Output Code=00110010 32

The circuit and procedure of this invention may be included in the manufacture of any integrated circuit, circuit board or component that requires both an electronic "signature" and a special "hidden" test mode of operation.

The indicator circuit of this invention includes an OR circuit having at least two inputs and an output. A signal input, such as twelve volts applied to address pin A9 in the example above, is connected to one input of the OR circuit and a special test mode signal input is connected to a second input of the OR circuit. A logic circuit for providing indicator signals has at least three inputs and at least two outputs. A first input to the logic circuit is connected to the output of the OR circuit. At least one address signal, such as address A0 in the example above, is connected to a second input of the logic circuit. The signal indicating the results of the special test mode is connected to a third input of the logic circuit. A first preprogrammed code indicator circuit has an input connected to a first output of the logic circuit and a second preprogrammed code indicator has an input connected to a second output of the logic circuit. The first preprogrammed code indicator may contain, for example, the manufacturer code. The second preprogrammed code indicator may contain, for example, the device code.

BRIEF DESCRIPTION OF THE DRAWINGS

The novel features of this invention are set forth in the appended claims. The invention, its features, and its advantages are described below in conjunction with the following drawings:

FIG. 1 is a representation of an integrated circuit layout for a four-megabit EPROM array.

DETAILED DESCRIPTION OF THE SPECIFIC EMBODIMENT

Referring to FIG. 1, an example of an integrated circuit layout for a nominal four-megabit EPROM is illustrated. The layout, in which dimensional proportions are not those of actual manufacture, illustrates sixteen 512x512 memory sub-arrays with redundant rows and columns used to replace rows and columns having defective cells. Peripheral circuitry, including row decoders, column decoders, virtual-ground decoders, wordline drivers, and column/segment pass gates, all of which function to connecting reading and programming voltages to the rows and columns of cells in response to address inputs routed through a predecoder and program path. Data are written into the memory arrays during programming operations. During reading operations, data from the memory arrays are routed through sense amplifiers to the output.

Figure 2:
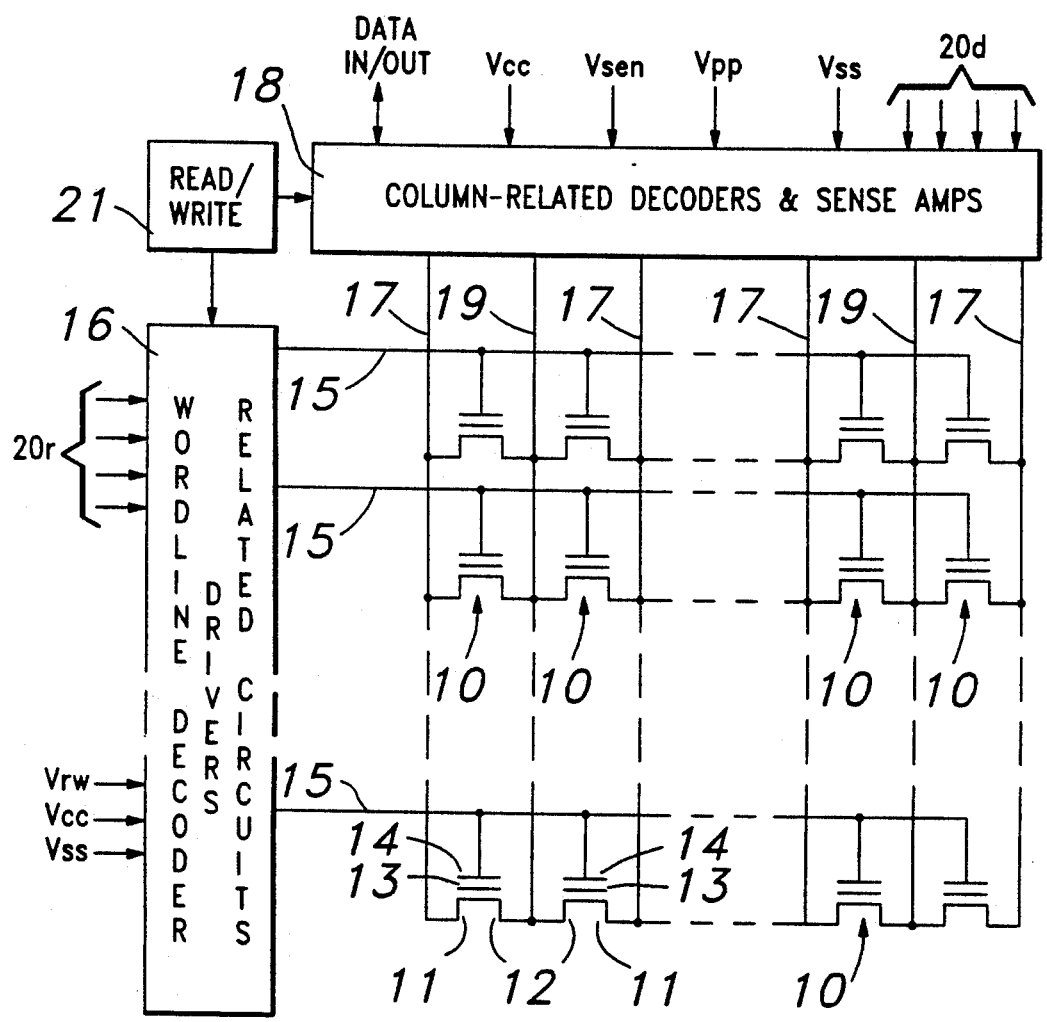
FIG. 2 is a representation of a part of a memory cell array and associated circuitry of the integrated circuit of FIG. 1.

Referring to FIG. 2, an example array of memory cells, which is a part of a memory chip such as that illustrated in FIG. 1, is shown. Each cell is a floating-gate transistor 10 having a source 11, a drain 12, a floating gate 13 and a control gate 14. Each of the control gates 14 in a row of cells 10 is connected to a wordline 15, and each of the wordlines 15 is connected to a wordline decoder 16, which includes wordline driver circuitry. Each of the sources 11 in a column of cells 10 is connected to a source-column line 17 (which may be a virtual-ground line), and each of the source-column lines 17 is connected to a column decoder 18, which includes a virtual ground and segment decoders and column/segment pass gates. Each of the drains 12 in a column of cells 10 is connected to a drain-column line 19, and each of the drain-column lines 19 is connected to the column decoder 18.

In a write or program mode, the wordline circuit 16 may function, in response to wordline address signals on lines 20r and to signals from Read/Write control circuit 21, (or a microprocessor 21) to place a preselected first programming voltage Vpp (approx. +12.5V) on a selected wordline 15, including a selected control-gate conductor 14. Column circuit 18 also functions to place a second programming voltage Vrw (Vpp reduced through an impedance to approx. +5 to +10V) on a selected source-column line 17 and, therefore, the source region 11 of selected cell 10. The selected drain-column line 19 is connected to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately $-2V$ to $-6V$ with respect to the channel region. The injected electrons and negative voltage in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, the wordline circuit 16 functions, in response to wordline address signals on lines 20r and to a signal from Read/Write control circuit 21, to apply a preselected positive voltage Vcc (approx. +3 to +5 volts) to the selected wordline 15 (and the selected control gate 14), and to apply a low voltage (ground or Vss) to deselected wordlines 15. The column circuit 18 functions, in response to column address signals on lines 20d, causes a sense amplifier to apply a preselected positive voltage Vsen (approx. +1 to +1.5 volts) to the selected drain-column line 19. The column circuit 18 also functions to connect all of the source-column lines 17 to ground (or Vss) except for the source-column line 17 sharing the same drain-column line connected to the cell 10 that is being read. That source-column line 17 is driven to the same voltage level as the selected drain-column line. The conductive or nonconductive state of the cell 10 connected to the selected drain-column line 19 and the selected wordline 15 is detected by a sense amplifier connected to the DATA OUT terminal.

As is well-known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are considered interchangeable for each mode of operation.

Figure 3:
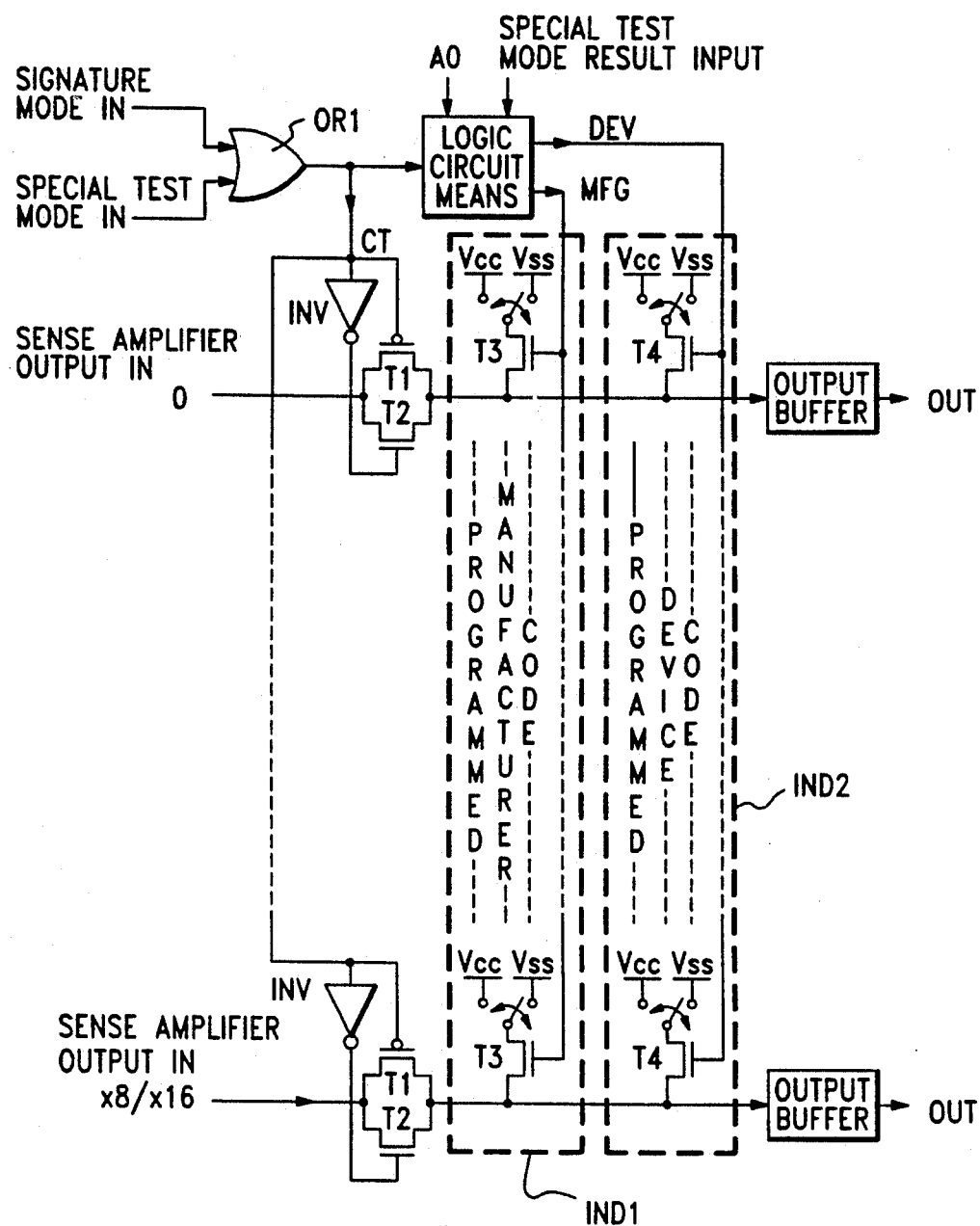
FIG. 3a is a representation, in partial block form, of a circuit for providing indication of special test results using preprogrammed indicators.

Referring now to FIG. 3, the indicator circuit of this invention comprises an OR circuit having at least two inputs and an output. A SIGNATURE MODE IN signal input (address A9 at high voltage in the example given in the Background section of this specification) is connected to one input to the OR circuit and a SPECIAL TEST MODE IN signal input is connected to a second input of the OR circuit. A LOGIC CIRCUIT MEANS for providing indicator signals has at least three inputs and at least two outputs. A first input to the LOGIC CIRCUIT MEANS is connected to the output of the OR circuit. At least one address signal A0, for example, is connected to a second input to the LOGIC CIRCUIT MEANS. A SPECIAL TEST MODE RESULT INPUT signal is connected to a third input to the LOGIC CIRCUIT MEANS. A first preprogrammed code indicator circuit IND1 has an input connected to a first output MFG of the LOGIC CIRCUIT MEANS and a second preprogrammed code indicator IND2 has an input connected to a second output DEV of the LOGIC CIRCUIT MEANS. First preprogrammed code indicator IND1 may contain, for example, the manufacturer code. Second preprogrammed code indicator IND2 may contain, for example, the device code.

Referring again to FIG. 3, when the SIGNATURE MODE IN or the SPECIAL TEST MODE IN inputs to the OR circuit are switched to Vcc voltage, each gate device, illustrated as field-effect transistors T1 and T2, becomes nonconductive upon application of the Vcc voltage to control terminal CT and the gates of the field-effect transistors T1 and T2. The gate device disconnects each OUTPUT BUFFER from the normal transmission of data from the output of one of the eight or sixteen SENSE AMPLIFIER OUTPUT IN terminals. While pass-gate transistors T1 and T2 are used in the example circuit of FIG. 3, other methods may be used to isolate, or to disconnect, the output buffers from the sense amplifiers.

Figure 4:
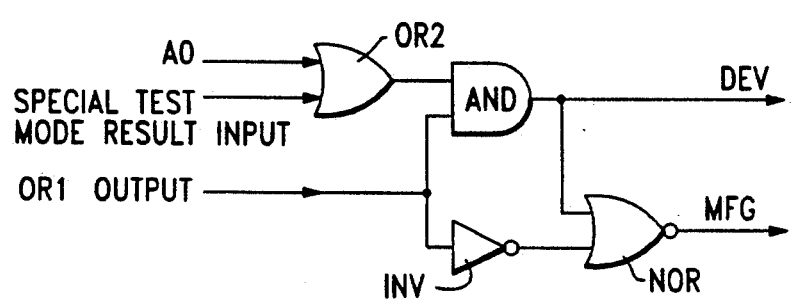
FIG. 4 is a logic circuit embodiment of the logic circuit means of FIG. 3.

Referring now to FIG. 4, an embodiment of LOGIC CIRCUIT MEANS of FIG. 3 is illustrated. A second OR circuit OR2 has at least two inputs and an output. The address signal A0 is connected to a first input to the second OR circuit and the SPECIAL TEST MODE RESULT INPUT signal is connected to a second input to the second OR circuit. An AND circuit has at least two inputs and an output. A first AND circuit input is connected to the output of the second OR circuit, a second AND circuit input is connected to the output of the first OR circuit OR1, and the AND circuit output DEV is connected to the input to the second preprogrammed indicator IND2. An inverter INV has an input and an output. The inverter INV input is also connected to the output of the first OR circuit OR1. A NOR circuit has at two inputs and an output. The first NOR circuit input is connected to the output of the AND circuit, the second of NOR circuit input is connected to the output of the inverter INV, and the NOR circuit output MFG is connected to the input to the first preprogrammed indicator IND.

If it is assumed that the result of the Special Test Mode operation is defined by the special test circuit to be address A0, then address A0 is used to force the input terminal of the output buffer circuit to be high (Vcc) or low (Vss). The circuit of FIG. 3 uses a N-channel transistor that ties the Input line to Vcc or Vss as needed. The hookup to the transistor is determined by the required signature code. This hookup can be "programmed" into the device in poly, metal, or nonvolatile elements.

With the addition of a small amount of logic, the results of a Special Test Mode may be observed by checking the outputs of the device for either the Manufacturer Code or the Device Code. Since the Manufacturer Code and the Device Code are standard outputs used in normal operation monitoring, observing the results of the Special Test Mode of operation is simplified.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. An indicator circuit, comprising:
   a first OR circuit having at least two inputs and an output;
   a signature mode signal input connected to one said input to said first OR circuit;
   a special test mode signal input connected to a second said input to said first OR circuit;
   a logic circuit means for providing indicator signals, said logic circuit means having at least three inputs and at least two outputs, a first of said inputs to said logic circuit means connected to said output of said first OR circuit;
   an address signal connected to a second of said inputs to said logic circuit means;
   a special test mode result input signal connected to a third of said inputs to said logic circuit means;
   a first preprogrammed code indicator having an input connected to a first of said outputs of said logic circuit means; and
   a second preprogrammed code indicator having an input connected to a second of said outputs of said logic circuit means.

2. The indicator circuit of claim 1, wherein said logic circuit means comprises:
   a second OR circuit having at least two inputs and an output;
   said address signal connected to a first of said inputs to said second OR circuit;
   said special test mode result input signal connected to a second of said inputs to said second OR circuit;
   an AND circuit having at least two inputs and an output, a first of said inputs to said AND circuit connected to said output of said second OR circuit, a second of said inputs to said AND circuit connected to said output of said first OR circuit, said output of said AND circuit connected to said input to said second preprogrammed indicator;
   an inverter having an input and an output, said input of said inverter connected to said output of said first OR circuit; and
   a NOR circuit having at least two inputs and an output, a first of said inputs to said NOR circuit connected to said output of said AND circuit, a second of said inputs to said NOR circuit connected to said output of said inverter, and said output of said NOR circuit connected to said input to said first preprogrammed indicator.

3. The indicator circuit of claim 1, including at least one gate device for isolating a sense amplifier from an output buffer, said gate device having a control terminal, wherein said output of said first NOR circuit is connected to said control terminal.

4. The indicator circuit of claim 1, including at least one field-effect transistor having a source-drain path and a gate, wherein said source-drain path of said field-effect transistor is connected between a sense amplifier and an output buffer and wherein said output of said first NOR circuit is connected to said gate of said field-effect transistor.

5. The indicator circuit of claim 1, wherein at least one of said first and second preprogrammed indicators comprise fused connections.

6. The indicator circuit of claim 1, wherein one of said first and second indicators comprises a manufacturer code.

7. The indicator circuit of claim 1, wherein one of said first and second indicators comprises a device code.

8. A method for indicating the results of a special test mode in a circuit having at least first and second preprogrammed indicator outputs responding to at least a first signature mode input and a signature address input and having special test mode input, the method comprising:
activating said first preprogrammed indicator output in response to a signal input to either said first signature mode input or said special test mode input and a signal input to either said signature address input or said special test result output; and
activating said second preprogrammed indicator output in response neither to a signal activating said first preprogrammed indicator nor to a signal input to either said first signature mode input or said special test mode input.

9. The method of claim 8, said circuit including at least one gate device for isolating a sense amplifier from an output buffer, the method including:
opening said gate device in response to a signal from either said signature mode input or said special test mode input.

10. The method of claim 8, said circuit including first and second preprogrammed indicators, wherein said preprogrammed indicators comprise fused connections.

11. The method of claim 8, wherein said wherein one of said first and second indicator outputs comprises a manufacturer code.

12. The method of claim 8, wherein one of said first and second indicator outputs comprises a device code.

* * * * *